United States Patent
Couet et al.

(10) Patent No.: US 12,096,700 B2
(45) Date of Patent: Sep. 17, 2024

(54) SPINTRONIC DEVICE WITH SYNTHETIC ANTIFERROMAGNET HYBRID STORAGE LAYER

(71) Applicant: IMEC vzw, Leuven (BE)

(72) Inventors: Sebastien Couet, Grez-Doiceau (BE); Van Dai Nguyen, Wavre (BE)

(73) Assignee: IMEC vzw, Leuven (BE)

( * ) Notice: Subject to any disclaimer, the term of this patent is extended or adjusted under 35 U.S.C. 154(b) by 13 days.

(21) Appl. No.: 16/909,718

(22) Filed: Jun. 23, 2020

(65) Prior Publication Data
US 2020/0403147 A1    Dec. 24, 2020

(30) Foreign Application Priority Data

Jun. 24, 2019 (EP) .................................. 19182043

(51) Int. Cl.
*H10N 52/80* (2023.01)
*H10B 61/00* (2023.01)
*H10N 50/85* (2023.01)
*H10N 52/00* (2023.01)

(52) U.S. Cl.
CPC ............. *H10N 52/80* (2023.02); *H10B 61/00* (2023.02); *H10N 50/85* (2023.02); *H10N 52/00* (2023.02)

(58) Field of Classification Search
CPC ....... H01L 43/04; H01L 27/222; H01L 43/06; H01L 43/10; G11C 11/1673; G11C 11/1675; G11C 11/18; G11C 11/161; H10N 52/80; H10N 50/85; H10N 52/00; H10B 61/00
See application file for complete search history.

(56) References Cited

U.S. PATENT DOCUMENTS

| 8,866,207 | B2 | 10/2014 | Hu et al. |
| 9,761,793 | B1* | 9/2017 | Kim ........................ H01L 43/08 |
| 10,103,319 | B2 | 10/2018 | Lee et al. |

(Continued)

FOREIGN PATENT DOCUMENTS

EP    3 442 042 A1    8/2017

OTHER PUBLICATIONS

Extended European Search Report dated Dec. 10, 2019 in counterpart European Patent Application No. 19182043.0 in 8 pages.

*Primary Examiner* — Nelson Garces
(74) *Attorney, Agent, or Firm* — Knobbe, Martens, Olson & Bear, LLP (57) ABSTRACT

The disclosed technology relates generally to magnetic devices, and more particularly to magnetic memory and/or logic devices. In an aspect, a spintronic device comprises a tunnel barrier, a storage layer provided on the tunnel barrier, and a seed layer provided on the storage layer. The storage layer includes a first magnetic layer having a first crystallographic orientation provided on the tunnel barrier, a spacer layer provided on the first magnetic layer, a second magnetic layer having a second crystallographic orientation provided on the spacer layer and exchange coupled to the first magnetic layer, an antiferromagnetic coupling layer provided on the second magnetic layer, and a third magnetic layer having the second crystallographic orientation provided on the antiferromagnetic coupling layer and antiferromagnetically coupled to the second magnetic layer.

20 Claims, 7 Drawing Sheets

(56) References Cited

U.S. PATENT DOCUMENTS

| | | | |
|---|---|---|---|
| 10,193,056 B2 | 1/2019 | Beach et al. | |
| 2008/0239589 A1* | 10/2008 | Guo | B82Y 40/00 |
| | | | 360/324.12 |
| 2011/0241139 A1* | 10/2011 | Yen | G11C 11/161 |
| | | | 257/E29.323 |
| 2012/0068284 A1* | 3/2012 | Kitagawa | H10N 50/10 |
| | | | 257/E29.323 |
| 2013/0234268 A1* | 9/2013 | Kariyada | H01L 43/14 |
| | | | 257/421 |
| 2014/0145792 A1* | 5/2014 | Wang | H10N 50/80 |
| | | | 428/828 |
| 2016/0155485 A1* | 6/2016 | Dieny | G11C 11/165 |
| | | | 365/158 |
| 2016/0284980 A1* | 9/2016 | Tonegawa | H01L 43/02 |
| 2019/0051822 A1* | 2/2019 | Chatterjee | G11C 11/161 |
| 2020/0013444 A1* | 1/2020 | Min | H01F 10/3272 |
| 2020/0035910 A1* | 1/2020 | Li | G11C 11/18 |
| 2020/0357556 A1* | 11/2020 | Lee | G11C 11/1675 |
| 2021/0034331 A1* | 2/2021 | Shibata | H10B 61/00 |
| 2021/0119114 A1* | 4/2021 | Fukami | H10N 50/85 |
| 2021/0193735 A1* | 6/2021 | Guo | H01L 43/10 |

\* cited by examiner

SPINTRONIC DEVICE WITH SYNTHETIC ANTIFERROMAGNET HYBRID STORAGE LAYER

CROSS-REFERENCE TO RELATED APPLICATIONS

This application claims foreign priority to European Application No. EP 19182043.0, filed Jun. 24, 2019, the contents of which is incorporated by reference herein in its entirety.

BACKGROUND

Field

The disclosed technology relates generally to magnetic devices, and more particularly to magnetic memory and/or logic devices.

Description of the Related Technology

In some magnetic memory and/or logic devices, information may be stored in a magnetic structure called the "storage layer" (also referred to as the "free layer," compared to another magnetic structure called the "fixed layer" or "reference layer"). Depending on the magnetization of the storage layer—with the fixed layer having a fixed magnetization—the storage layer is considered to store a digital "0" or "1."

In some magnetic devices, the storage layer may be formed of CoFeB, or a similar material, and can incorporate a heavy metal layer such as Ta, W, etc., in order to increase its magnetic anisotropy. Such structure can improve the retention characteristic of the storage layer, and thus of the magnetic device as a whole. However, figures of merit of a storage layer includes not only the retention ($\Delta$), which should be as high as possible, but also the switching current ($I_{SW}$), which should be as low as possible. A storage layer with excellent figure of merit is obviously desired.

SUMMARY OF CERTAIN INVENTIVE ASPECTS

In view of various challenges and the disadvantages of conventional designs, the disclosed technology aims to provide an improved spintronic device. An objective is in particular to provide a spintronic device with a storage layer having a high figure of merit. That means, the storage layer should show an increased retention and/or reduced switching current. The storage layer should further be more robust to etch stop conditions as mentioned above. Another goal is to design the storage layer such that the material stack can be optimized for different sizes of the spintronic device.

The objective is achieved by the embodiments of the disclosed technology provided in the enclosed independent claims. Advantageous implementations of these embodiments are defined in the dependent claims.

The embodiments of the disclosed technology rely on a synthetic antiferromagnet hybrid storage layer design. Thereby, embodiments of the disclosed technology can include both bottom-pinned and top-pinned spintronic devices. For a top-pinned device, the storage layer is arranged at the bottom of the full device (e.g., magnetic random access memory (MRAM) stack). For a bottom-pinned device, the storage layer is arranged at the top of the stack. The top-pinned device geometry is currently used/ evaluated to realize spin logic devices, such as the spin torque majority gate (STMG) device. It is also the more likely/expected geometry for high-density memory concepts, such as a racetrack memory device. These types of devices also utilized the fact that magnetic information is transported via magnetic domain wall motion, hence putting additional requirements on the properties of the storage layer, such as high domain wall speed, and robustness against domain wall pinning.

A first aspect of the disclosed technology provides a spintronic device, comprising: a tunnel barrier and a storage layer provided on the tunnel barrier. The storage layer includes a first magnetic layer having a first crystallographic orientation provided on the tunnel barrier, a spacer layer provided on the first magnetic layer, a second magnetic layer having a second crystallographic orientation provided on the spacer layer and exchange coupled to the first magnetic layer, an antiferromagnetic coupling layer provided on the second magnetic layer, a third magnetic layer having the second crystallographic orientation provided on the antiferromagnetic coupling layer and antiferromagnetically coupled to the second magnetic layer; and a seed layer provided on the third magnetic layer.

In this document, a layer being "provided on" another layer may either mean that the layer is arranged "below" (for a top-pinned device) or "above" (for a bottom-pinned device) the other layer. Thereby, the terms "below"/"above" or "bottom"/"top" relate to layers of the material stack, in particular to the fabrication/growth direction of these layers. In any case, "provided on" means that the layer is formed on, e.g., in contact with, the other layer. For instance, the layer may be (epitaxially) grown on the other layer.

It is also noted that the seed layer may be a part of the storage layer, or may be a separate layer provided on the storage layer. For instance, in case that the spintronic device is a racetrack memory device, or a domain wall logic device, the seed layer may belong to the storage free layer.

In the spintronic device of the first aspect, due to the antiferromagnetic alignment in the storage layer, a smaller net magnetic moment is obtained. Hence, the storage layer can be much less sensitive to stray fields induced by the fixed layer. In particular, the storage layer can be realized with almost zero net magnetic moment. This, for instance, allows the material stack to be optimized for spintronic devices of largely different sizes. Further, this allows increasing the total volume of the storage layer, thus enabling a significant increase in the retention ($\Delta$), e.g., compared to some hybrid free layer designs, e.g., that shown in FIG. 6(b). Further, this also allows reducing the required switching current ($I_{SW}$), likely because of a second torque originating from the second magnetic layer. Overall, the figure of merit of the storage layer of the spintronic device of the first aspect is strongly improved, e.g., it may have a higher $\Delta$ at a lower $I_{SW}$. Accordingly, an improved spintronic device is provided.

Moreover, especially for logic or domain wall movement applications, the spintronic device of the first aspect can provide a thicker storage layer with additional intrinsic PMA material, which makes it more robust to the above-described etch stop conditions. Thus, fabricating a STMG device is feasible with the proposed storage layer design.

Further, due to a partial cancellation of the dipolar field, domain walls in the storage layer of the spintronic device of the first aspect tend to be narrower than in a conventional device/storage layer. This is beneficial for the design of a racetrack memory device with ultrahigh density. Also, much higher domain wall speeds can be enabled (e.g., a faster operation is possible), due to the existence of an additional exchange coupling torque, which is proportional to the strength of the antiferromagnetic coupling between the magnetic layers of the storage layer.

In an implementation of the spintronic device, the first magnetic layer is a CoFeB or FeB layer.

In an implementation of the spintronic device, the second magnetic layer is a Co-based layer.

The Co-based second magnetic layer can be a Co layer. However, it can generally be a layer based on Co, for instance, a CoNi, CoPt, or CoFe layer, or a laminate or an alloy thereof.

In an implementation of the spintronic device, the third magnetic layer is a Co-based layer.

The Co-based third magnetic layer can be a Co layer. However, it can generally be a layer based on Co, for instance, a CoNi, CoPt, CoPt, or CoFe layer, or a laminate or an alloy thereof.

In an implementation of the spintronic device, the first crystallographic orientation is a (100) orientation, and/or the second crystallographic orientation is a (111) orientation.

Generally, the first and second crystallographic orientations are different.

In an implementation of the spintronic device, a thickness of the first magnetic layer and/or of the second magnetic layer is in a range of 0.4-1.5 nm.

In an implementation of the spintronic device, the antiferromagnetic coupling layer is a Ru layer, an Ir layer, or a Rh layer.

In particular, the antiferromagnetic coupling may be an antiferromagnetic Ruderman-Kittel-Kasuya-Yosida (RKKY) coupling. The RKKY coupling generates an antiferromagnetic arrangement of spins in the second magnetic layer and spins in the third magnetic layer, respectively. The strength of this antiferromagnetic RKKY coupling is a function of the thickness of the antiferromagnetic coupling layer arranged between the second and third magnetic layer. For specific thicknesses of the antiferromagnetic coupling layer, the RKKY coupling strength shows peaks.

Here, the Ru layer may particularly be a Ru (0.4, 0.8) layer and/or the Ir layer may particularly be an Ir (0.5, 0.9) layer. Thereby, "0.4" and "0.8" denote thicknesses of the Ru layer in nm, at which peaks appear in the antiferromagnetic RKKY coupling. Likewise, "0.5" and "0.9" denote thicknesses of the Ir layer in nm, at which such coupling peaks appear. In particular, the given thicknesses are related to the first peak and the second peak in the strength of the antiferromagnetic RKKY coupling, respectively. Preferably, the first peak or the second peak is employed, e.g., the antiferromagnetic coupling layer is preferably either made of Ru having a thickness of 0.4 nm or 0.8 nm, or is made of Ir having a thickness of 0.5 nm or 0.9 nm. However, it is also possible to employ the third peak or the fourth peak (or even other peaks), namely by providing even thicker antiferromagnetic coupling layers made of Ru or Ir, respectively. By using RKKY coupling, e.g., an RKKY antiferromagnetic coupling layer, an antiferromagnetic coupling with sufficient strength can be achieved, such that both parts of the storage layer will reverse together.

In an implementation of the spintronic device, the spacer layer is configured to provide a texture breaking between the different crystallographic orientations of the first magnetic layer and the second magnetic layer having, respectively, and/or the spacer layer is a heavy-metal layer or a heavy-metal transition-metal alloy layer.

In an implementation of the spintronic device, the seed layer is a heavy-metal layer or a topological insulator, and/or the seed layer is a SOT generating layer.

In particular, the heavy-metal layer may be Ta, W, or preferably Pt. The topological insulator may be $Bi_2Se_3$ or $Bi_xSb_{1-x}$.

In an implementation of the spintronic device, the tunnel barrier is a MgO-based layer.

The MgO-based tunnel barrier can be a MgO layer. However, it can generally be a layer based on MgO, for instance, a $MgGaO_x$ or $MgAlO_x$ layer. $O_x$ can, e.g., be O, $O_2$, $O_3$, etc.

In an implementation the spintronic device further comprises a fixed layer provided on an opposite side of the tunnel barrier than the storage layer.

The fixed layer may be a CoFeB layer.

In an implementation of the spintronic device, the spintronic device is a three-terminal device, and two terminals are connected to the seed layer.

A third terminal may be connected to the fixed layer. The spintronic device may, however, also be a two-terminal device, in which one terminal may be connected to the fixed layer and one terminal may be connected to the seed layer.

In an implementation of the spintronic device, the spintronic device is a memory device, in particular is a spin torque transfer (STT) MRAM, device, a spin orbit torque (SOT) MRAM device, or a magnetic racetrack memory device.

In an implementation of the spintronic device, the spintronic device is a domain wall logic device, in particular is a STMG device.

A second aspect of the disclosed technology provides a method for manufacturing a spintronic device. The method comprises providing a tunnel barrier and providing a storage layer on the tunnel barrier. Providing the storage layer includes: providing a first magnetic layer having a first crystallographic orientation on the tunnel barrier; providing a spacer layer on the first magnetic layer; providing a second magnetic layer having a second crystallographic orientation on the spacer layer, wherein the second magnetic layer is exchange coupled to the first magnetic layer; providing an antiferromagnetic coupling layer on the second magnetic layer; providing a third magnetic layer having the second crystallographic orientation on the antiferromagnetic coupling layer, wherein the third magnetic layer is antiferromagnetically coupled to the second magnetic layer; and the method further comprises providing a seed layer on the third magnetic layer.

The method of the second aspect can be further developed according to the implementations described above for the spintronic device of the first aspect. The method of the second aspect thus achieves the same advantages as the spintronic device of the first aspect and its implementations.

BRIEF DESCRIPTION OF THE DRAWINGS

The above described aspects and implementations are explained in the following description of embodiments with respect to the enclosed drawings.

DETAILED DESCRIPTION OF CERTAIN ILLUSTRATIVE EMBODIMENTS

Figure 6A:
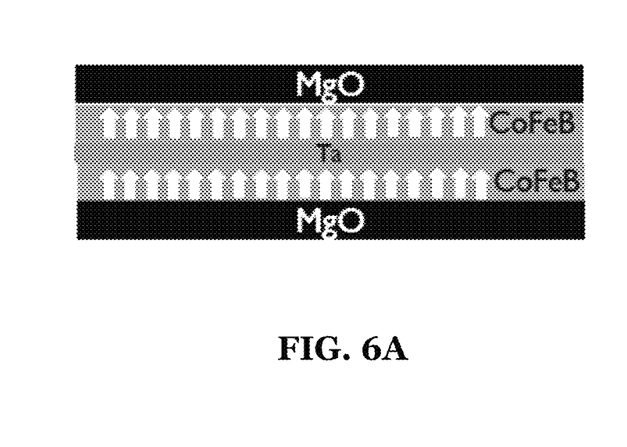
FIGS. 6A and 6B show example spintronic devices.

An example storage layer design (referred to as "double MgO storage layer") is shown in FIG. 6(a). In this design, two MgO layers sandwich two CoFeB layers, which are separated by a Ta layer. One of the MgO layers functions as a tunnel barrier that separates the storage layer (free layer) from the fixed layer (reference layer). The design of FIG. 6(a) relies on interfacial perpendicular magnetic anisotropy (PMA) originating from the CoFeB/MgO interface. Such design, however, can prevent the realization of a STMG device and/or racetrack memory device with this design.

An SMTG device including the layer design shown in FIG. 6(a) can be difficult to manufacture, which can include a particular pillar patterning step. This pillar patterning step may include etching the material stack, and stopping in a controlled manner directly on the MgO layer (e.g., just above the storage layer for a top-pinned device). Etching all the way to the MgO layer is to avoid shorting current paths between the pillars. However, during the etch process, etching ions can penetrate a few nm deep into the material. Thus, damages may be produced, before the MgO layer is reached, which can lead to a collapse of the CoFeB PMA.

Figure 6B:
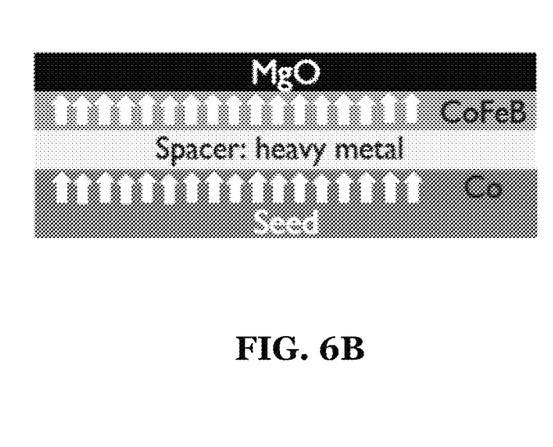
Figure 7:
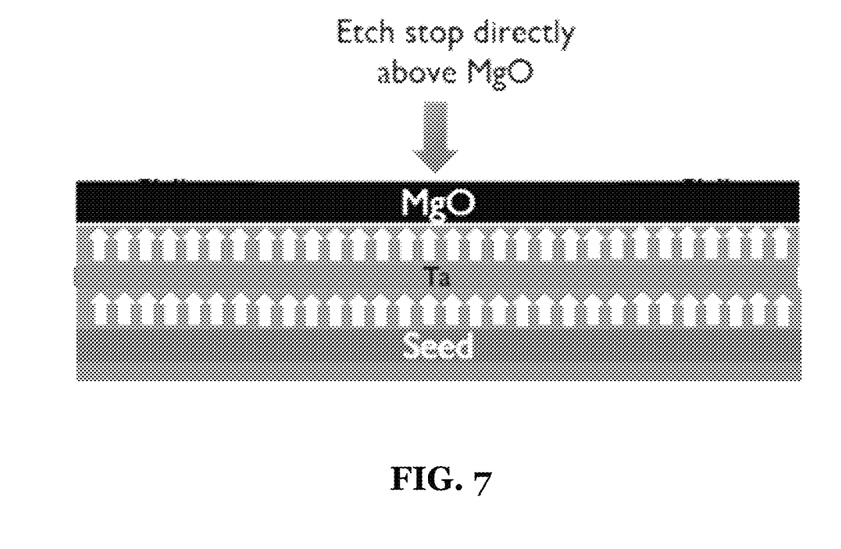
FIG. 7 shows an etch stop in patterning a spintronic device.

One possible way to circumvent the above limitation may be to fabricate a storage layer that contains material with intrinsic PMA, which will be more resistant to potential etch damage. Such a conventional storage layer design (referred to as "hybrid storage layer") is shown in FIG. 6(b). In the design shown in FIG. 6(b), a CoFeB layer may be provided on the MgO tunnel barrier, a spacer layer on the CoFeB layer, a Co layer on the spacer layer, and a seed layer on the Co layer. The etch stop condition for producing a STMG device, is illustrated in FIG. 7. A drawback of this design is that the resulting device may need a relatively high switching current, because of the higher anisotropy materials that are used.

To address various needs of magnetic devices described above, a spintronic device is disclosed herein. The spintronic device can include a storage layer, which is based on a synthetic antiferromagnet hybrid layer. The spintronic device may, for instance, be a spin torque transfer (STT) magnetic random access memory (MRAM) device, or a spin orbit torque (SOT) MRAM device. The spintronic device may also be a domain wall logic device, or a spin torque majority gate (STMG) device.

Figure 1:
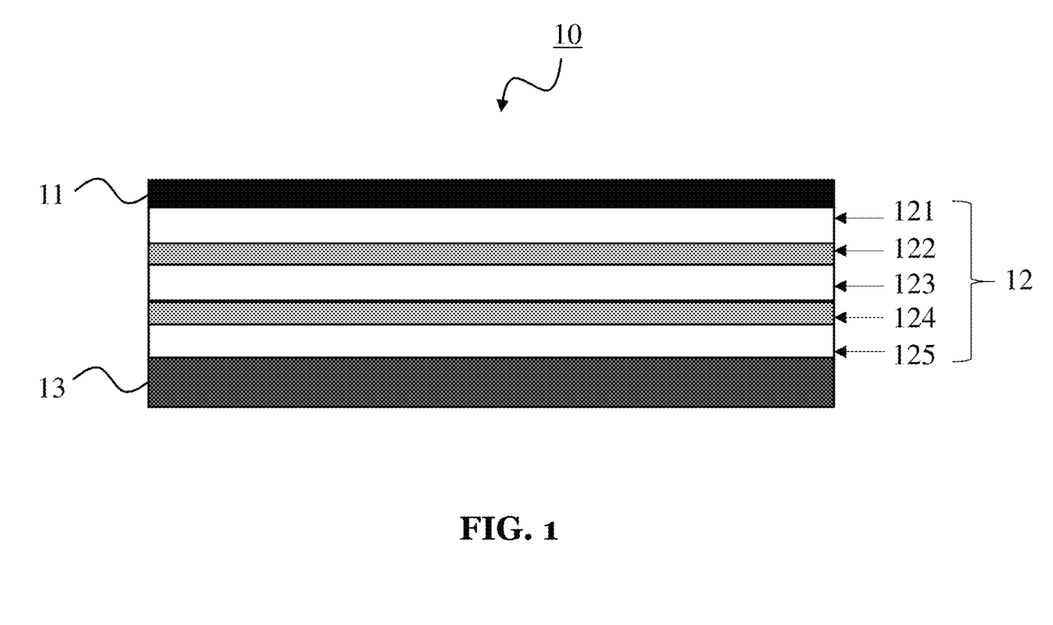
FIG. 1 shows a spintronic device according to an embodiment of the disclosed technology.

FIG. 1 shows a spintronic device 10 according to an embodiment of the disclosed technology. The spintronic device 10 may be a logic device or a memory device. In particular, the spintronic device 10 may be a STT-MRAM device, a SOT-MRAM device, a magnetic racetrack memory device, a domain wall logic device, or a STMG device.

The spintronic device 10 comprises generally a tunnel barrier 11, a storage layer 12, and a seed layer 13. The storage layer 12 is arranged between the tunnel barrier 11 and the seed layer 13. The storage layer 12 is thus provided on the tunnel barrier 11, and the seed layer 13 may be provided on the storage layer 12. The seed layer 13 may alternatively be a part of the storage layer 12 (for some device configurations).

The storage layer 12 includes, in particular, a first magnetic layer 121 provided on the tunnel barrier 11. The first magnetic layer 121, e.g., a major surface thereof, has a first crystallographic orientation. Further, the storage layer 12 comprises a spacer layer 122 provided on the first magnetic layer 121, and a second magnetic layer 123 provided on the spacer layer 122. The second magnetic layer 123, e.g., a major surface thereof, has a second crystallographic orientation, particularly a crystallographic orientation different than the first magnetic layer 121. The second magnetic layer 123 is furthermore exchange coupled (magnetic exchange interaction) to the first magnetic layer 121, e.g., through the spacer layer 122.

Further, the storage layer 12 includes an antiferromagnetic coupling layer 124 provided on the second magnetic layer 123, and a third magnetic layer 125 provided on the antiferromagnetic coupling layer 124. The third magnetic layer 125, e.g., a major surface thereof, has the second crystallographic orientation, i.e., the same crystallographic orientation as the second magnetic layer 123. The third magnetic layer 125 is antiferromagnetically coupled to the second magnetic layer 123, e.g., via the antiferromagnetic coupling layer 124.

Figure 2:
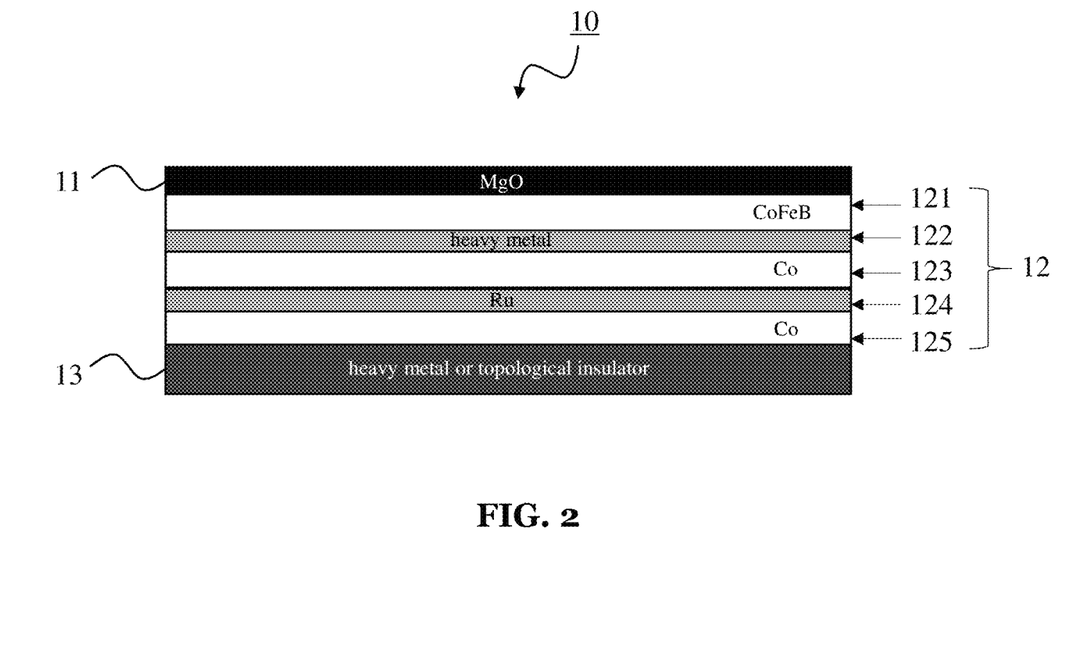
FIG. 2 shows an exemplary spintronic device according to an embodiment of the disclosed technology.

FIG. 2 shows an exemplary spintronic device 10 according to an embodiment of the disclosed technology, which builds on the spintronic device 10 shown in FIG. 1. In particular, FIG. 2 shows a particular implementation of the spintronic device 10 of FIG. 1.

Starting from the MgO tunnel barrier 11, the storage layer 12 of the spintronic device 10 of FIG. 2 is in particular composed of:

A CoFeB or FeB layer as the first magnetic layer 121, in order to provide the Tunnel Magnetoresistance (TMR) effect for device read, and the spin transfer torque (STT) effect for device write. A thickness range for the first magnetic layer 121 may be 0.4 to 1.4 nm.

The spacer layer 122 also called a texture breaking layer. Its role is to provide a texture breaking between the different crystallographic orientations of the first magnetic layer 121 and of the second magnetic layer 123. In particular, a texture breaking between the (100)-oriented CoFeB and (111)-oriented Co layer as the second magnetic layer 123 is provided. The spacer layer 122 typically comprises a heavy metal layer, such as Ta, W, or Mo. Alternatively, it may comprise a heavy metal-transition metal alloy, such as TaCoFeB, TaFe, TaCoFe, TaCo, or WCoFeB.

A first Co layer as the second magnetic layer 123, which is exchange coupled to the CoFeB layer 121 (over the spacer layer 122). A thickness range for the second magnetic layer 123 may be 0.4 to 1.5 nm.

The antiferromagnetic coupling layer 124, which is typically a Ru layer or Ir layer, particularly Ru (0.4, 0.8), or Ir (0.5, 0.9), or a Rh layer.

A second Co layer as the third magnetic layer 125, which is antiferromagnetically coupled to the first Co layer 123 via the coupling layer 124.

The seed layer 13, which may support the Co PMA, may provide Dzyaloshinskii-Moriya interaction and SOT on domain wall (DW) motion. The seed layer 13 may comprise a heavy metal layer, e.g. Pt, Ta, or W, layer. It could also be a topological insulator such as $Bi_2Se_3$ or $Bi_xSb_{1-x}$.

FIG. 2 shows specifically a MgO tunnel barrier 11, a CoFeB layer 121 provided on the MgO tunnel barrier 11, a heavy metal layer 122 provided on the CoFeB layer 121, a first Co layer 123 provided on the heavy metal layer 122, a Ru layer 124 provided on the first Co layer 123, a second Co layer 125 provided on the Ru layer 124, and a heavy metal or insulator seed layer 13 provided on the second Co layer 125. However, different combinations of materials according to the above-provide exemplary materials are possible.

Figure 3:
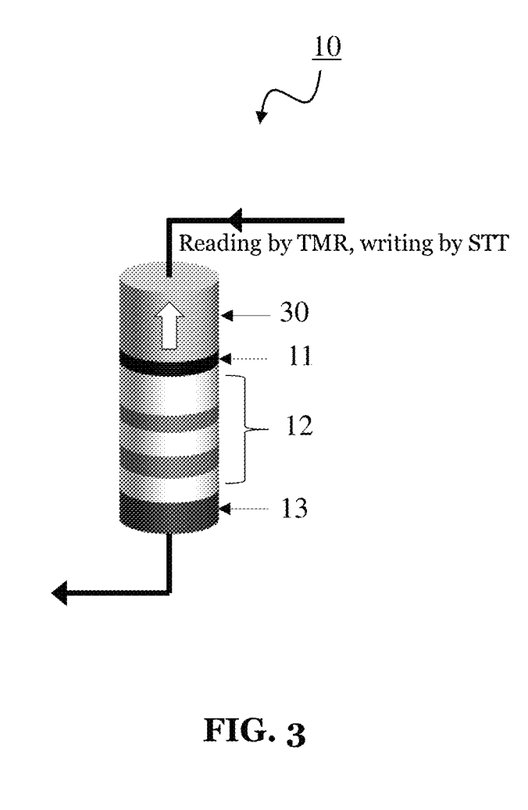
FIG. 3 shows a spintronic device according to an embodiment of the disclosed technology, for STT-MRAM application.

FIG. 3 shows a spintronic device 10 according to an embodiment of the disclosed technology, for a STT-MRAM application. The spintronic device 10 of FIG. 3 is in particular a two-terminal device. One terminal is connected to the seed layer 13, and the other terminal is connected to a fixed layer 30.

The spintronic device 10 includes the tunnel barrier 11, which is provided on the fixed layer 30 and separates it from the storage layer 12. That means the fixed layer 30 is provided on the other side of the tunnel barrier 11 than the storage layer 12. The storage layer 12 is provided on the tunnel barrier 11 and includes the first magnetic layer 121, spacer layer 122, second magnetic layer 123, antiferromagnetic coupling layer 124, and third magnetic layer 125, as described above with respect to FIG. 1 and/or FIG. 2. The spintronic device 10 further includes the seed layer 13, which may also be implemented as described above.

In the spintronic device 10 of FIG. 3, writing into the storage layer 12 can be carried out by means of STT (sending a spin-polarized switching current $I_{SW}$ through fixed layer 30 and tunnel barrier 11 into the storage layer, as in a conventional STT-MRAM), and reading from the storage layer 12 can carried out by means of TMR, as in a conventional MRAM.

Figure 4:
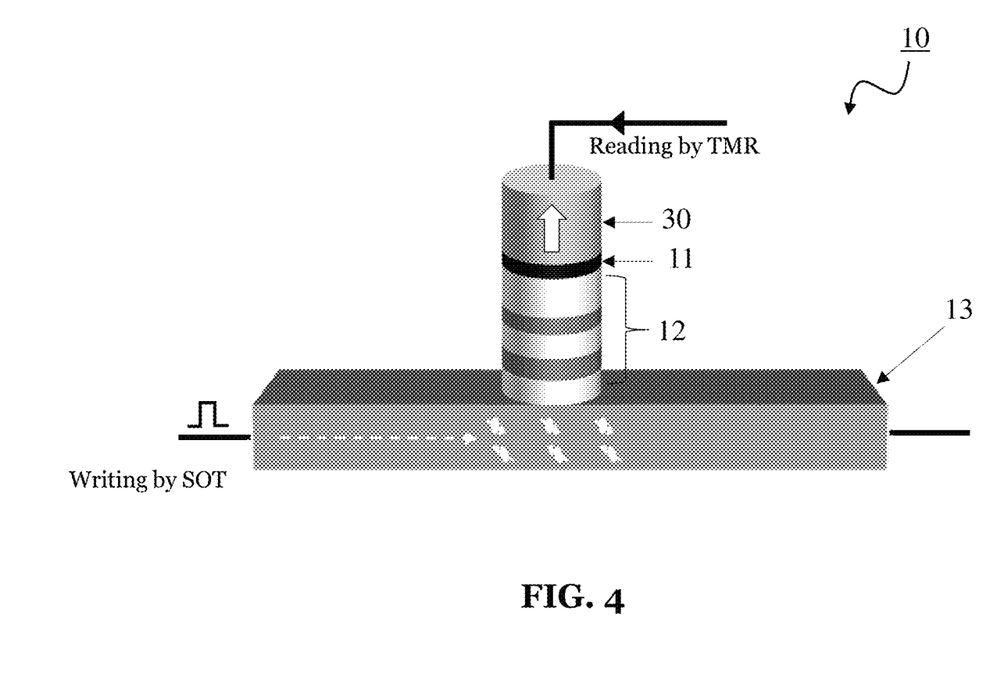
FIG. 4 shows a spintronic device according to an embodiment of the disclosed technology, for SOT-MRAM application.

FIG. 4 shows a spintronic device 10 according to an embodiment of the disclosed technology, for a SOT-MRAM application. The spintronic device 10 of FIG. 4 is in particular a three-terminal device. Two terminals are connected to the seed layer 13, and the third terminal is connected to a fixed layer 30.

The spintronic device 10 includes the tunnel barrier 11, which is provided on the fixed layer 30 and separates it from the storage layer 12. The storage layer 12 is provided on the tunnel barrier 11 and includes the first magnetic layer 121, spacer layer 122, second magnetic layer 123, antiferromagnetic coupling layer 124, and third magnetic layer 125, as described above with respect to FIG. 1 and/or FIG. 2. The spintronic device 10 further includes the seed layer 13, which may also be implemented as described above. The seed layer 13 may serve as basis carrying the patterned (pillar-patterned) storage layer 12, tunnel barrier 11 and fixed layer 30.

In the spintronic device 10 of FIG. 4, writing into the storage layer 12 can be carried out by means of SOT (via the two terminals connected to the seed layer 13). This may be supported by a high SOT efficiency layer as the seed layer 13, like Pt, Ta, W or a topological insulator layer. Reading from the storage layer 12 can be carried out by means of TMR, as in FIG. 3, via the terminal connected to the fixed layer 30.

Figure 5:
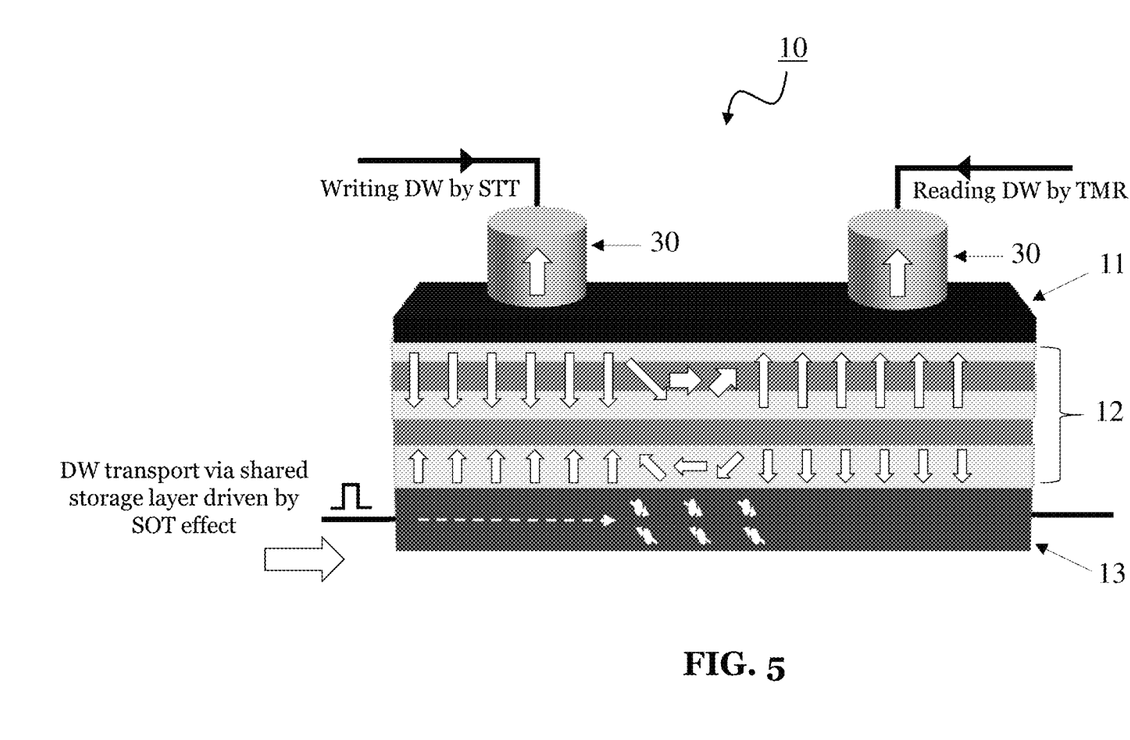
FIG. 5 shows a spintronic device according to an embodiment of the disclosed technology, for spin logic and racetrack memory applications.

FIG. 5 shows a spintronic device 10 according to an embodiment of the disclosed technology, for spin logic and racetrack memory applications. The spintronic device 10 of FIG. 5 is in particular a three-terminal device (or even a more-than-three-terminal device). Two terminals are connected to the seed layer 13, and one or more third terminals are each connected to a fixed layer 30. For instance, two third terminals may be connected each to a separate pillar of fixed layer 30 (separated by patterning), as shown in FIG. 5.

The spintronic device 10 includes the tunnel barrier 11, which is provided on the (pillars of) fixed layer(s) 30 and separates it/them from the storage layer 12. That is, the storage layer 12 may be shared between different pillars of fixed layer 30. The storage layer 12 is provided on the tunnel barrier 11 and includes the first magnetic layer 121, spacer layer 122, second magnetic layer 123, antiferromagnetic coupling layer 124, and third magnetic layer 125 as described above with respect to FIG. 1 and/or FIG. 2. The spintronic device 10 further includes the seed layer 13, which may also be implemented as described above. Since the seed layer 13 may also be shared between different pillars of fixed layer 13, it may be considered to be a part of the (shared) storage layer 12 in this spintronic device 10.

In the spintronic device 10 of FIG. 5, writing DW into the storage layer 12 can be carried out by means of STT (e.g., via one terminal connected to the fixed layer 30, particularly to one pillar of fixed layer 30). Reading DW can be carried out by TMR (e.g., via another terminal connected to the fixed layer 30, particularly to another pillar of fixed layer 30). DW transport can be carried out via shared the storage layer 12, driven by a SOT effect of the shared seed layer 13. For this, the two terminals connected to the seed layer 13 may be used. The seed layer 13 may thus be a SOT generating layer, for instance, a Pt, Ta, W or topological insulator layer.

In summary, the embodiments of the spintronic device 10 according to the disclosed technology are useful for memory applications and for logic applications.

Memory applications may specifically include:

A STT-MRAM pillar device with a higher retention (Δ) and a lower switching current ($I_{SW}$), less sensitivity to stray fields, and eliminated offset fields (thus enabling different device sizes/masks).

A SOT-MRAM device enabling a higher A, high switching speeds, eliminated offset field, and having less sensitivity to stray fields.

A magnetic racetrack memory device enabling higher density and higher speed DW motions with TMR read and STT write.

Logic applications may specifically include:

A STMG device with a lower $I_{SW}$, higher domain wall speeds, and more robustness to pillar etching conditions.

Other logic devices making use of an extended storage layer 12.

In each embodiment, the spintronic device 10 according to the disclosed technology thus benefits from the storage layer 12, designed as a synthetic antiferromagnet hybrid storage layer.

What is claimed is:

1. A spintronic device, comprising:
a first electrical terminal;
a fixed layer, the fixed layer directly connected to the first electrical terminal;
a tunnel barrier formed on the fixed layer;
a storage layer formed on the tunnel barrier, wherein the storage layer includes:
a first magnetic layer having a first crystallographic orientation formed on the tunnel barrier,
a spacer layer formed on the first magnetic layer,
a second magnetic layer having a second crystallographic orientation different from the first crystallographic orientation formed on the spacer layer and exchange-coupled to the first magnetic layer, an antiferromagnetic coupling layer formed on the second magnetic layer, and a third magnetic layer having the second crystallographic orientation formed on the antiferromagnetic coupling layer and antiferromagnetically coupled to the second magnetic layer; and a seed layer, wherein the third magnetic layer is grown directly on the seed layer such that the seed layer is in direct physical contact with the third magnetic layer, wherein the seed layer is a single layer formed of a heavy-metal layer, a topological insulator or a spin-orbit-torque generating layer directly connected to a second electrical terminal of the spintronic device, wherein the antiferromagnetic coupling layer is a Ruderman-Kittel-Kasuya-Yosida (RKKY) antiferromagnetic coupling layer adapted to cause simultaneous reversal of magnetization in the second and third magnetic layers, and wherein the antiferromagnetic coupling layer is a Ru layer, an Ir layer, or a Rh layer.

2. The spintronic device according to claim 1, wherein the first magnetic layer is a CoFeB layer or a FeB layer.

3. The spintronic device according to claim 1, wherein the second magnetic layer is a Co-based layer.

4. The spintronic device according to claim 1, wherein the third magnetic layer is a Co-based layer.

5. The spintronic device according to claim 1, wherein:
the first crystallographic orientation is a (100) orientation, and
the second crystallographic orientation is a (111) orientation.

6. The spintronic device according to claim 1, wherein one or both of the first magnetic layer and the second magnetic layer have a thickness of 0.4 nm-1.5 nm.

7. The spintronic device according to claim 1, wherein the antiferromagnetic coupling layer is a Ru layer having 0.4 nm or 0.8 nm, or an Ir layer having 0.5 nm or 0.9 nm adapted for generating a peak of RKKY antiferromagnetic coupling strength.

8. The spintronic device according to claim 1, wherein the spacer layer is configured to break a texture between the different crystallographic orientations of the first magnetic layer and the second magnetic layer.

9. The spintronic device according to claim 1, wherein the spacer layer is a heavy-metal layer or a heavy-metal transition-metal alloy layer.

10. The spintronic device according to claim 1, wherein the seed layer is the heavy-metal layer comprising Ta, W or Pt.

11. The spintronic device according to claim 1, wherein the seed layer is the topological insulator comprising $Bi_2Se_3$ or $Bi_xSb_{1-x}$.

12. The spintronic device according to claim 1, wherein the seed layer is the spin-orbit-torque generating layer.

13. The spintronic device according to claim 1, wherein the tunnel barrier is a MgO-based layer.

14. The spintronic device according to claim 1, further comprising a fixed layer on an opposite side of the tunnel barrier relative to the storage layer.

15. The spintronic device according to claim 1, wherein the spintronic device is a three-terminal device comprising two of three terminals connected to the seed layer.

16. The spintronic device according to claim 15, wherein one of the three terminals of the spintronic device is connected to a fixed layer comprising CoFeB and formed on an opposite side of the tunnel barrier relative to the storage layer.

17. The spintronic device according to claim 1, wherein the spintronic device is a spin torque transfer magnetic random access memory (MRAM) device, a spin orbit torque MRAM device, or a magnetic racetrack memory device.

18. The spintronic device according to claim 1, wherein the spintronic device is a domain wall logic device.

19. The spintronic device according to claim 1, wherein one or both of the second magnetic layer and the third magnetic layer are Co layers.

20. The spintronic device according to claim 19, wherein the seed layer supports perpendicular magnetic anisotropy of the Co layers.

* * * * *